United States Patent [19]

Foust et al.

[11] Patent Number: 5,198,096
[45] Date of Patent: Mar. 30, 1993

[54] METHOD OF PREPARING POLYCARBONATE SURFACES FOR SUBSEQUENT PLATING THEREON AND IMPROVED METAL-PLATED PLASTIC ARTICLES MADE THEREFROM

[75] Inventors: Donald F. Foust, Scotia; Lewis A. Bernstein, North Tonawanda, both of N.Y.

[73] Assignee: General Electric Company, Schenectady, N.Y.

[21] Appl. No.: 618,808

[22] Filed: Nov. 28, 1990

[51] Int. Cl.$^5$ .............................................. C25D 5/56
[52] U.S. Cl. ..................................... 205/210; 205/164; 205/167; 205/924; 156/668; 427/307
[58] Field of Search ................. 427/307, 306; 156/668

[56] References Cited

U.S. PATENT DOCUMENTS

| | | | |
|---|---|---|---|
| 3,515,649 | 2/1970 | Hepper | 156/668 |
| 3,518,067 | 6/1970 | Barth | 156/668 |
| 4,125,649 | 11/1978 | Donovan et al. | 156/668 |
| 4,325,992 | 4/1982 | Donovan, III et al. | 427/307 |
| 4,425,380 | 1/1984 | Nuzzi et al. | 427/97 |
| 4,592,852 | 6/1986 | Courduvelis et al. | 252/79.1 |
| 4,629,636 | 12/1986 | Courduvelis et al. | 427/444 |
| 4,775,557 | 10/1988 | Bastenbeck et al. | 156/668 |
| 4,842,946 | 6/1989 | Foust et al. | 428/458 |
| 4,859,300 | 8/1989 | Sullivan et al. | 204/164 |
| 4,959,121 | 9/1990 | Dumas et al. | 156/668 |
| 5,015,329 | 5/1991 | Patel et al. | 156/668 |
| 5,019,425 | 5/1991 | Römer et al. | 156/668 |

FOREIGN PATENT DOCUMENTS 3708214 9/1988 Fed. Rep. of Germany .

OTHER PUBLICATIONS

Konar, J. and Ghosh, R., Studies on adhesion of polyethylene. Part I. Influence of functionality and phase transfer catalyst, 1989, p. 609-621, J. Adhesion Sci. Technol. vol. 3, No. 8.
Pramanik, P. and Bhattacharya, S., Deposition of chalcogenide thin films by solution growth techniques on polymer surfaces, 6, 1987, pp. 1105-1106, Journal of Material Science Letters.
Kita, T and Sato K., Plating of Polyacetal, (Jul. 1987), pp. 58-63, Plating and Surface Finishing.

Primary Examiner—John Niebling
Assistant Examiner—Kishor Mayekar
Attorney, Agent, or Firm—Sudhir G. Deshmukh; James C. Davis, Jr.; William H. Pittman

[57] ABSTRACT

Method of modifying a polycarbonate surface to improve adhesion of a metal layer thereon and to the articles produced therefrom. The surface is first rendered hydrophilic by an exposure to actinic light such as ultraviolet light. The surface is then impregnated with a diffuser such as hydrochloric acid. The surface after impregnation is etched with a base such as potassium hydroxide and cleaned by oxidizing it with a solution of an oxidizing agent such as potassium permanganate. The cleaned surface is then neutralized by contacting it with a mild reducing agent. The chemically and physically modified surface is electrolessly plated with a primary metal layer. A secondary metal layer is then electrolessly or electrolytically applied on top of the primary metal layer until a metal layer of a desired thickness is attained.

The present invention further discloses articles such as an EMI shielded enclosure, a printed circuit board and a reflector for a light emitting device having metal layers as an EMI shield, a conductive metal trace pattern and a reflective surface respectively.

9 Claims, 2 Drawing Sheets

METHOD OF PREPARING POLYCARBONATE SURFACES FOR SUBSEQUENT PLATING THEREON AND IMPROVED METAL-PLATED PLASTIC ARTICLES MADE THEREFROM

CROSS REFERENCE TO RELATED APPLICATION

Reference is made to co-pending application Ser. No. 07/603,648, filed on Oct. 25, 1990, for Method of Preparing Polymer Surfaces for Subsequent Plating Thereon and Improved Metal-Plated Plastic Articles Made Therefrom, assigned to the same assignee as the present invention and incorporated herein by reference.

BACKGROUND OF THE INVENTION

The present invention is directed to improved methods of plating metal on a polycarbonate surface, and to improvements in the quality of metal plated polycarbonate substrates.

Ever since structural plastics have replaced metal in the enclosures used in electrical appliances, microwave ovens, business machines, and other electrical/electronic products, manufacturers have had to overcome problems caused by electromagnetic interference (EMI) in general and radio frequency interference (RFI) in particular. The Federal Communications Commission (FCC), since 1983, requires that the electrical products not exceed certain specified EMI/RFI levels. The FCC requirements have been codified in the FCC regulation CRF 47, Part 15, Subsection J. The FCC requirements are met by reducing the EMI/RFI emission from the electrical/electronic products by providing a shielding. With the increased sensitivity of newer, higher-speed, and higher-frequency circuits plus a continued proliferation of electronic devices worldwide, EMI shielding problems are becoming more demanding. This has placed greater emphasis on high signal attenuation by the shielding medium.

The EMI shielded enclosures are also used to protect delicate electronic/electrical circuitry and components enclosed within the enclosure from damage by external sources such as static electricity or man-made high intensity EMI emission produced by an atmospheric nuclear explosion.

Electromagnetic and radio-frequency interference are often referred to as electronic noise. Electronic noise may occur naturally from sources such as lightening or static electricity or from man-made sources such as radio signals, radio games, computers, calculators, cash registers, electrical motors, automobile ignition systems, and all kinds of appliances, especially those that incorporate electronic components. A well-shielded enclosure enclosing the electrical components is often the quickest and most cost-effective way to suppress man-made electromagnetic noise.

Enclosures having metal cases, metal foil claddings, wire mesh screens, applied coatings, magnetic materials, and a variety of alternative approaches have been tried. However, because of their cost advantages and ease of processing, plastic enclosures having metallized coatings have emerged as the dominant choice.

In addition to aforementioned plastic enclosures the present invention is also directed to printed circuit boards that have become the dominant vehicle for mounting and interconnecting electronic components used for manufacturing a desired electronic circuit. The printed circuit board usually comprises a sheet of a dielectric substrate constructed from various filled or unfilled synthetic materials. The substrate is provided with a pattern of thin metal foil which functions as a conductive path on one or both sides. The paths or "traces" are usually formed of a conductive material such as copper, palladium, nickel or gold. The traces collectively define all of the electrical connections between components on the board, and are routed between the locations on the board.

Polycarbonates are suitable for printed circuit board substrates because of their impact strength, heat resistance, dimensional stability, and ease of moldability. However, polycarbonate substrates are not easily provided with a strongly adherent metal trace. The printed circuit, i.e., the plated metal conductive path, can be damaged or separated from the substrate during the subsequent manufacturing steps or during use of the circuit board.

Currently, a number of approaches have been tried to solve the problem of applying metallized coatings onto the plastic enclosures or substrates. One involves adding an electrically conductive material to a polymer composition from which a shielded enclosure is molded or formed. However, this method is limited by the type and the amount of conductive additives that can be incorporated into the polymer composition before the physical properties of the composition begin to deteriorate to unacceptable levels. Some work has been done in producing parts made from inherently conductive polymers, such as polyarylenes, however, these materials are intrinsically unstable.

A second approach involves the use of metal-loaded paints. Silver was popular before its rise in price. The paint industry has investigated all types of substitutes, including carbon black, copper and nickel. The most promising paints appear to be those loaded with nickel or copper. However, painted EMI shields are fraught with a number of problems such as chemical attack by the paint solvent on the under underlying substrate, difficulty in disposing the paint waste in an environmentally safe manner, flaking, scratching or scuffing of the painted surface, difficulty in controlling the thickness of the painted surfaces, and the high cost of a painting operation.

Several attempts have been made to produce effective EMI shields at a reasonable cost. One of the most effective and promising methods involves electroless plating of the surfaces of the EMI shielded enclosures. Electroless or autocatalytic plating is defined as a deposition of a metal or alloy coating on a suitable substrate by a controlled chemical reduction that is catalyzed by the metal or alloy being deposited. *Thin Film Processes* (1978). Vossen, J. and Kern, K., Page 213, lines 5–7. A great advantage of the electroless plating solutions is their ability to deposit conductive metal films or layers of properly prepared non-conductors and their ability to uniformly coat any plateable objects. Electroless plating permits the deposition of pure-metal films onto a prepared molded part surface. Electrolessly metal plated surfaces of the substrates can be then easily electroplated to a desired thickness, either with the same metal or with a different metal or alloy. Polycarbonates are particularly suitable for making EMI shielded enclosures or housings due to their high impact strength, heat resistance, dimensional stability, and ease of moldability. However, polycarbonate substrates can not be easily electrolessly plated or coated with a strongly adherent conductive metal layer.

Several attempts have been made to increase the adhesion of a conductive metal layer to polycarbonate substrates. Adhesion is generally measured as a "pull strength", i.e. a force required to peel an adherent metal layer from an underlying substrate under controlled conditions. The controlled conditions are specified in The American National Standard Test titled ANSI/ASTM D 3359-76, Measuring Adhesion by Tape Test (Cross Hatch Tape Test) and in the IPC-TM-650 Peel Test issued by the Institute for Interconnecting and Packaging Electronic Circuits.

One of the prior art methods for improving adhesion involves grit blasting the surface to provide a roughened profile on which the subsequently-applied metals can be anchored. Other methods call for the use of chemical swelling agents or penetrants to swell the surface prior to the application of a metal layer.

While such methods do increase adhesion, they are often not entirely satisfactory for several reasons. Such techniques result in physical degradation of the polycarbonate surface thereby decreasing the tensile as well the impact strength of the underlying polycarbonate substrate. The aforementioned physical degradation results from the swelling and cracking steps to which the entire substrate material is exposed. Additionally, such surface preparations cause crack formation and propagation at highly stressed areas such as at sharp corners or edges of the enclosure being shielded.

Therefore the primary object of this invention is to provide an environmentally safe method of applying highly adherent metal layers on a surface of a polycarbonate substrate by chemically and physically modifying the surface.

Another object of this invention is to provide a metal plated polycarbonate substrate in the form of an EMI shielded enclosure wherein the noise generated by the enclosed electrical/electronics components is reduced to a desired level by the shielded enclosure.

Still another object of the present invention is to provide a polycarbonate substrate having oxidized polycarbonate molecules disposed on surfaces of the substrate.

Yet another object of the present invention is to provide a polycarbonate substrate having clean shallow etch pits having an aspect ratio of less than 4 disposed along surfaces of the substrate.

Further object of the present invention is to provide a printed circuit board comprising an electrically conductive electrolessly plated metal trace pattern disposed on a modified surface of a polycarbonate substrate, the pattern having an improved adhesion to the surface of the substrate.

SUMMARY OF THE INVENTION

The present invention is directed to a method of modifying a polycarbonate surface to improve adhesion of a metal layer on the surface comprising wetting the surface, impregnating the wetted surface with a diffuser, etching the impregnated surface with a base, and cleaning the etched surface with a cleansing agent. The surface is wetted by exposing it to actinic light such as ultraviolet light or to a surfactant. The surface is then impregnated by contacting it with a diffuser such as hydrochloric acid. The impregnated surface is etched by contacting it with a base such as an aqueous solution of potassium hydroxide. The etched surface is then cleaned by contacting it with a cleansing agent such as a mixture of potassium permanganate and potassium hydroxide. A thin insoluble film of $MnO_2$ formed during the contact of the surface with potassium permanganate is removed by a mild reducing agent. As a result of the aforementioned process the polycarbonate surface has shallow etch pits having an aspect ratio of less than about 4. The polycarbonate molecules disposed on the surface are oxidized by potassium permanganate used during the cleaning step.

The present invention also discloses a method for applying a metal layer on the surface chemically and physically modified by the aforementioned method. A primary metal layer is electrolessly applied on the modified surface. A secondary metal layer may then be electrolessly or electrolytically applied on top of the primary metal layer until the metal layer of a desired thickness is attained. A primary metal layer of copper may be followed by a secondary metal layer of nickel.

The present invention further discloses articles such as an EMI shielded enclosure, a printed circuit board and a reflector for light emitting device all having metal layers as an EMI shield, a conductive metal trace pattern and a reflective surface respectively.

BRIEF DESCRIPTION OF THE DRAWINGS

Other objects and advantages of the present invention will appear upon consideration of the following detailed description in conjunction with the accompanying drawings wherein.

DETAILED DESCRIPTION OF THE INVENTION

Figure 2:
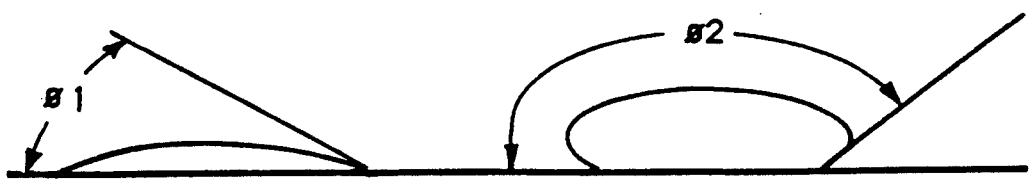
FIG. 2 is a rendition distinguishing a hydrophobic and a hydrophilic surface.

The present invention is directed to pre-treating a polycarbonate surface by chemically and physically modifying its surface to improve adhesion of a metal layer deposited on the surface. Generally an adhesive bond between the metal layer and the surface of the underlying substrate is established by interfacial molecular contact between the metal layer and the surface. The interfacial molecular contact is proportional to the wettability of the polymer surface. As shown in FIG. 2, the wettability of the polymer surface is defined in terms of an angle of contact of a liquid droplet on a surface. A wettable (hydrophilic) surface will have acute angle (less than 90°) of contact ($\phi 1$ in FIG. 2) whereas a non-wettable (hydrophobic) surface ($\phi 2$ in FIG. 2) will have obtuse angle (more than 90°) of contact.

Figure 1:
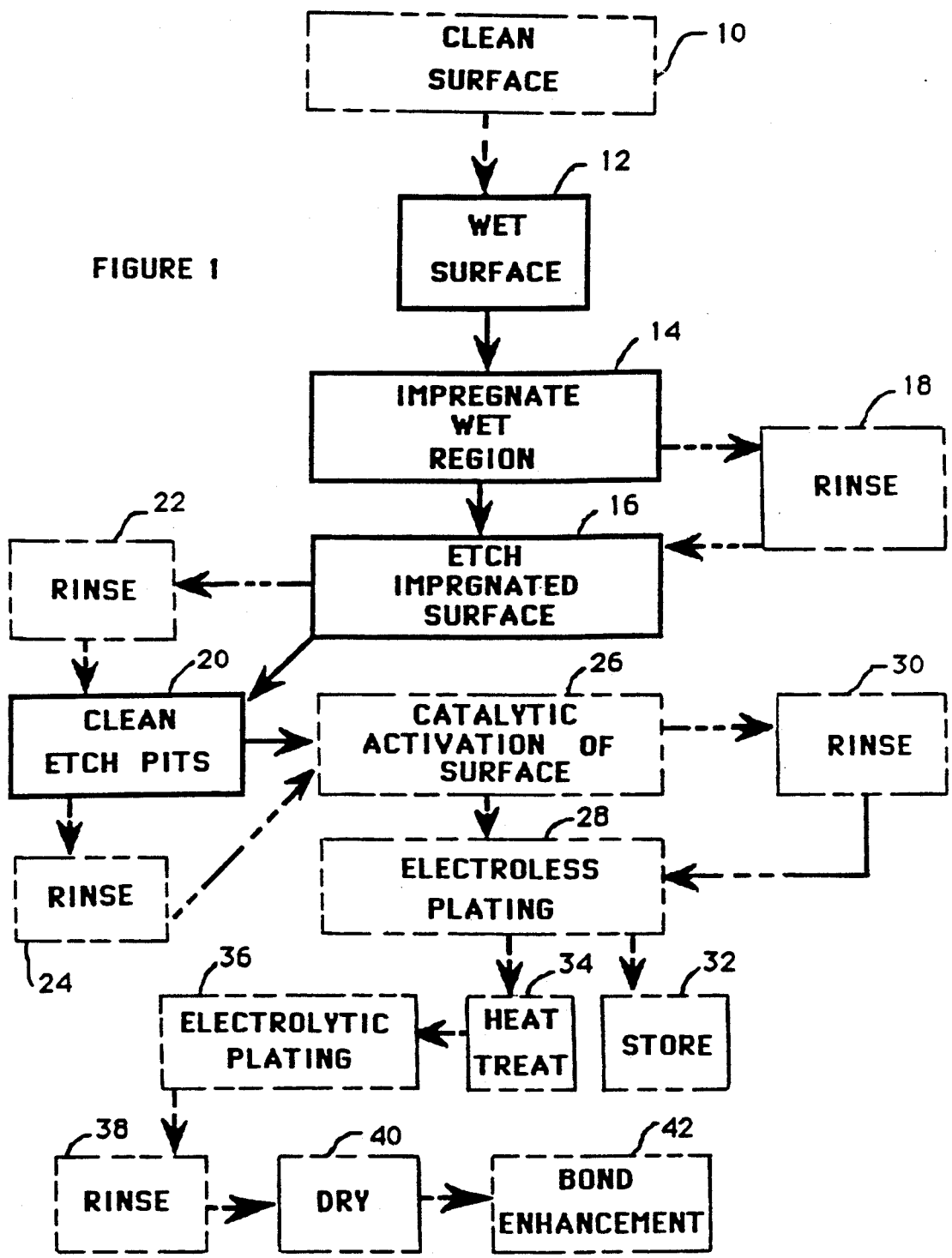
FIG. 1 is a generalized flow chart depicting, step-by-step, the present novel method of improving adhesion of a metal layer on a polycarbonate surface.

In one of its embodiments the process of this invention includes several steps shown in a flow chart of FIG. 1. The steps of the invention provide for modifying the surface of a polycarbonate substrate, such as an EMI shielded enclosure, for improving adhesion of a metal layer thereon. The surface is modified by sequentially contacting the surface with the solutions disclosed hereinafter. A modified surface is then catalytically activated to permit electroless metal deposition. A catalytically activated surface is electrolessly plated with a metal layer of a desired thickness. In subsequent steps the electrolessly plated (autocatalytically plated) surface may be electrolytically plated (electroplated) or electrolessly plated with another layer of a metal similar to the one underneath or a different one. The steps are normally interposed with rinsing steps.

The polymeric surface used in the present invention is of polycarbonate polymer. The term "surface" or "polycarbonate surface" means a surface of a polycarbonate substrate that may be in the form of an article such as an EMI shielded enclosure or a printed circuit board substrate. Polycarbonate (PC) may be prepared by the reaction of dihydroxy aromatic compound such as bisphenol A with carbonyl chloride in an interfacial process. This reaction may be carried out under basic conditions in presence of an aqueous and organic phase. Aromatic polycarbonates have a recurring moiety having the formula,

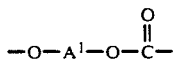

where $A^1$ is an aromatic radical. Illustrative $A^1$ radicals include those derived from bisphenol A, 2,2',6,6'-tetramethyl bisphenol A and 1,1-dichloro-2,2-bis(4-hydroxyphenyl) ethylene. Typical polycarbonates prepared from these and other aromatic dihydroxy compounds are well known in the art as illustrated by the following patents, incorporated herein by reference:

| 3,135,008 | 3,334,154 | 4,073,814 | 4,217,438 |
| 3,157,622 | 3,635,895 | 4,130,548 | 4,239,918 |
| 3,169,121 | 3,737,409 | 4,195,157 | 4,379,910 |
| 3,269,986 | | | |

The polycarbonate resins are commercially produced as Lexan ® polycarbonate by General Electric Company, Makrolon ® polycarbonate by Mobay Corporation and Calibre ® polycarbonate by Dow Chemical Company.

The polycarbonate substrate disclosed in the present invention may also include various additives used for different purposes. The additives incorporated in polycarbonate of the present invention comprise flame retardants, polymer chain initiators, polymer chain inhibitors, polymer chain stabilizers, plasticizers, color pigments, ultraviolet radiation absorbing agents, microwave absorbing agents, anti-static agents, impact modifiers, glass fibers, glass beads, carbon fibers, internal mold release agents, anti-oxidants, fillers, chemical blowing agents, silica, mica, or mixtures thereof.

In the flow chart of FIG. 1, steps disclosed within the broken line blocks are art recognized steps whereas steps disclosed within the solid line blocks are steps of the present invention.

Referring now to FIG. 1, an initial step 10 of the subject method may comprise subjecting a polycarbonate surface to a surface cleaner for removing fingerprints, particulate matter such as dust, and grease. Typical surface cleaners suitable for polycarbonate are solvents such as Freon ® TF 1,1,2-trichlorotrifluoroethane. However environmentally safe cleaners such as Shipley Acid Cleaner 1118 are better.

Step 12 of the present invention, shown in FIG. 1, provides for wetting of the surface. A wet or a nascent surface is a surface on which a solution is retained after the surface is immersed therein. Such retention or increase in hydrophilicity of the surface may be caused by any one or combination of the phenomena known as adsorption, physical adsorption, chemisorption, wetting, and absorption. During the wetting step, the surface is wetted for an effective time to increase the hydrophilicity of the surface. The surface is wetted by actinic light such as ultraviolet light having a frequency of about 254 nanometers to about 365 nanometers, preferably about 254 nanometers or a surfactant such as Fluorad ® fluorinated surfactant FC-95 or FC-98 in concentration of about 0.05% to about 1.0% by weight in distilled water. The effective time for the actinic light exposure is about 20 minutes to about 60 minutes, about 30 minutes being the preferred time.

Figure 3:
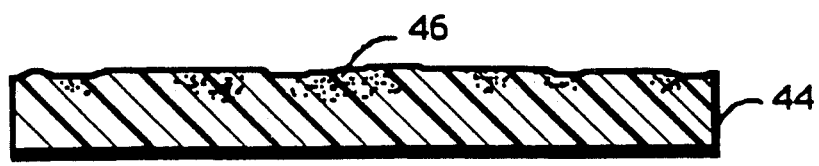
FIG. 3 depicts the seepage of a diffuser on a polycarbonate surface during an impregnating step.

In second step 14 of the present invention, shown in FIG. 1, the wet surface is impregnated for an effective time and at an effective temperature with a diffuser of effective concentration. During the impregnation step the diffuser seeps into the polycarbonate surface to provide effective sites at which subsequently performed etching step can occur. FIG. 3 shows sites 46. The exact mechanism by which sites 46 are generated is not clear, however it is theorized, without dependence thereon, that impregnation at sites 46 with the diffuser makes them more amenable to a subsequently conducted etching action. The effective time for which the diffuser is contacted with the surface is about 2 to about 10 minutes, preferably for about 5 minutes. The effective temperature of the diffuser is about 15° C. to about 50° C., preferably at about 25° C. The diffuser of the present invention comprises an aqueous solution of hydrogen halide, ammonia, nitric acid mixed with sulfuric acid, or nitric acid mixed with orthophosphoric acid. Hydrogen halide includes hydrochloric acid, hydrobromic acid, hydroiodic acid and hydrofluoric acid. The preferred diffuser is hydrochloric acid dissolved in water at an effective concentration of about 30% to about 40% by volume, preferably at about 36% by volume.

Figure 4:
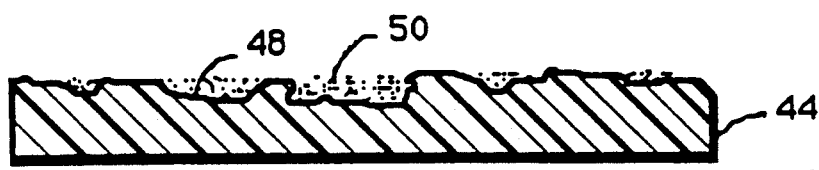
FIG. 4 shows the creation of etch pits during an etching step.
Figure 7:
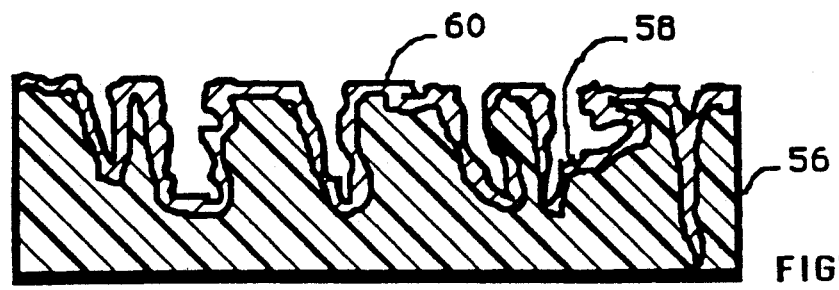
FIG. 7 illustrates the etch pits created by an etching action of the prior art.

In etching step 16 of the present invention, as shown in FIG. 1, the impregnated surface is etched for effective time and at effective temperature with a base. Etching step 16 may be interposed with a rinse step 18 shown in FIG. 1. During the etching action the base chemically attacks sites 46, as seen in FIG. 4, to create etch pits 48 having the aspect ratio of less that 4. The aspect ratio is defined as the ratio of the depth of the etch pit to the diameter of the etch pit. FIG. 7 shows typical prior art etch pits 58 having the aspect ratio of more than 4 created by the prior art process on a polycarbonate substrate 56. Typically the aspect ratio of prior art etch pits 58 tends to be about 10 or more. By decreasing the aspect ratio, the present invention reduces damage brought about on a polycarbonate surface by the etching process. The higher the aspect ratio, the more will be the damage sustained by the polycarbonate surface. The etching action also produces debris 50 in etch pits 48, shown in FIG. 4. Debris 50 may comprise of bits of polymeric chain remnants that may still be chemically attached to the walls of etch pits 48. The effective time of contact of the base with the impregnated surface is about 3 to about 20 minutes, preferably about 5 minutes.

The temperature of the base during the etching action is about 40° C. to about 90° C., preferably at 65° C. The base of the present invention comprises an aqueous solution of alkali metal hydroxide, calcium hydroxide, or tetraalkylammonium hydroxide. The preferred base is potassium hydroxide dissolved in water at a concentration of about 5% by weight to about 60% by weight, preferably 30% by weight.

Figure 5:
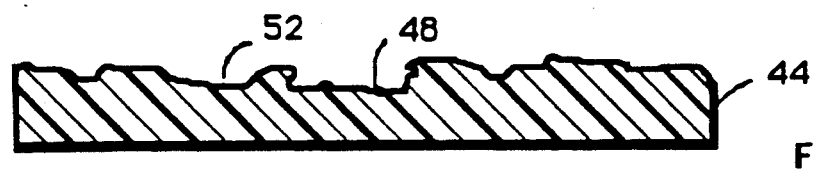
FIG. 5 reveals the etch pits after a cleaning step.
Figure 6:
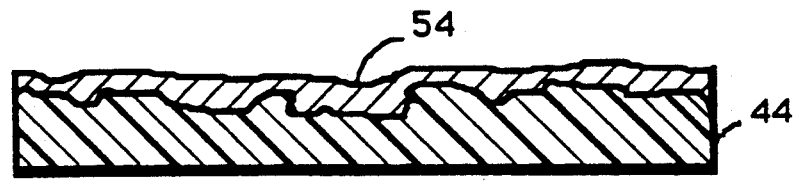
FIG. 6 points out the manner in which electrolessly deposited metal layer anchors to the surface having cleaned etch pits.

The presence of debris 50 in etch pits 48 has a detrimental effect on a subsequently deposited metal layer on the surface; consequently debris 50 are purged before the deposition of the aforementioned metal layer. The fourth step 20 of the present invention, shown in FIG. 1, provides for cleaning of the etch pits 48 by chemically removing in effective time debris 50 from etch pits 48 with a cleansing agent of effective concentration. A rinsing step 22 may be interposed between the cleaning and the etching step. FIG. 5 shows cleaned etch pits 52. The effective time of contact of the cleansing agent with the surface is about 3 to about 20 minutes, preferably about 10 minutes and the effective temperature during the contact is about 40° C. to about 90° C., preferably at about 82° C. The cleansing agent comprises an oxidizing agent or a solubilizing agent. The oxidizing agent comprises an aqueous solution of potassium permanganate and alkali hydroxide. The solubilizing agent comprises an aqueous solution of alkylpyridinium halide, alkyltrimethylammonium halide, alkyltriphenylphosphonium halide or tetraalkylammonium halide. The solubilizing agents disclosed as cationic surfactants in U.S. Pat. No. 4,873,136 to Foust et al. are incorporated herein by reference. The preferred cleansing agent is an oxidizing agent comprising an aqueous mixture of about 0.5% to about 7.5% by weight of potassium permanganate and about 0.5% to about 20% of potassium hydroxide, the most preferred oxidizing agent having 6% by weight of potassium permanganate and 7% by weight of potassium hydroxide.

When potassium permanganate is present in the oxidizing agent a brown manganese film of $MnO_2$ may be present on the surface. Such a film is neutralized by contacting the surface with a mild reducing agent such as an aqueous solution of about 1% to about 10% by weight stannous chloride in 5% hydrochloric acid, an aqueous solution of about 1% to about 30% by weight of hydrogen peroxide, Shipley Circuposit ® MLB neutralizer 216, an aqueous solution of about 1% to about 30% by weight of sodium bisulfite or an aqueous solution of about 1% to about 30% by weight of hydroxylamine hydrochloride at a temperature of about 50° C., preferably at a concentration of about 5% by weight. The mild reducing agents disclosed in U.S. Pat. No. 4,515,829 to Deckert et al. are incorporated herein by reference. The aforementioned
reducing agents are strong enough to dissolve $MnO_2$ film but are mild enough to have little effect on the makeup of the cleaned polycarbonate surface.

If an oxidizing agent such as potassium permanganate is utilized to clean the surface of the substrate, the molecules disposed along the surface are oxidized. The presence of oxidized molecules along the polycarbonate surface was confirmed by chemical element analysis. The surface was chemically analyzed to a depth of 50 Å by means of X-ray photoelectron spectroscopy. It was determined that, 1) there was increase in oxygen level,
2) some of the carbon backbone (C—C, C=C, C—H) functionalities were oxidized,
3) there was increase in C—O— functionality, and
4) that there was significant decrease in

functionality.

As used hereinabove "effective time, temperature and concentration" relate to a period of duration, degrees of temperature and concentration respectively required to achieve a sufficient level of wetting, impregnating, etching and cleaning necessary to produce a desired result on the surface and those skilled in the art will readily realize that by manipulating the concentrations and the temperatures of the various aforementioned reagents used in the present invention, the time of contact may be optimized for particular processing conditions. The polycarbonate surface may be contacted with the aforementioned reagents by either immersing the surface in a bath containing the particular reagent or by spraying or painting the particular reagent on the desired area of the surface. For example a polycarbonate surface in the form of an EMI enclosure may be contacted for cosmetic reasons on the inner or hidden walls or surfaces of the enclosure. The aforementioned methods of contacting the surface with the reagents are well known in the art.

In activation step 26, shown in FIG. 1, the cleaned surfaces are catalytically activated by the methods well-known in the art and described, for example, in U.S. Pat. No. 3,589,916, as well as in U.S. Pat. Nos. 4,873,136 and 4,842,946 to Foust et al., and in U.S. Pat. No. 4,775,449 to Dumas et al., all aforementioned patents being incorporated herein by reference. For example, the substrate may be catalytically activated by contacting with an acid solution of a precious metal, such as palladium chloride in hydrochloric acid, for a period of time sufficient to cause the catalytic activation of the substrate surface, wherein the palladium is adsorbed on the exposed surfaces. The cleaned surface may be rinsed, as shown in a step 24 of FIG. 1, and then catalytically activated.

It is often useful to begin the catalytic activation of the surface by treatment with additives which aid in adsorption of the plating catalyst. Such additives are well-known in the art. Exemplary aids to catalyst adsorption include Shipley 1175A, a product of the Shipley Company, and Metex 9420, a product of the MacDermid Corporation. Immersion in about 0.1% to about 5% by volume of either of these agents in water for about 1 minute to about 10 minutes as a temperature of about 40° C. to about 80° C. is usually sufficient. Although such a treatment is not deemed critical to the present invention, its use often enhances the uniform deposition of electrolessly applied metals onto the substrate.

One illustrative catalytic activation technique, shown as step 26 in FIG. 1, involves immersing the substrate in a solution of Shipley Cataprep ® 404, a product of the Shipley Company. This solution provides a protecting agent for the plating catalyst subsequently applied, and comprises sodium bisulfate and various surfactants. The substrate may then be immersed in a solution of Shipley Cataposit ® 44, which contains the Cataprep ® 404 ingredients, tin, and palladium, later being the electroless plating catalyst. Shipley Cataprep ® 404 is applied for about one minute at about 25° C., followed by Shipley Cataposit ® 44 diluted in water to about 1.5% concentration and applied for about 3 minutes at about 44° C. After a two minute water rinse, the surface may then be immersed at 25° C. for about 3 minute in a solution in water of Shipley Cuposit ® Accelerator 19, a fluoroboric acid-containing formulation used to separate tin from the plating catalyst.

Activation and plating processes suitable for the present invention are also described in the application of W. T. Grubb et al., EP No. 272,420, incorporated herein by reference, and also in U.S. Pat. Nos. 3,011,920 and 3,841,881, issued to Shipley and Feldstein et al., respectively, both of which are also incorporated herein by reference. A water rinse generally follows the activation step.

After surface activation and rinsing, the fourth step of the present invention namely, electroless plating of a primary metal layer can be undertaken. Illustrative metals used to form the metallization layer include copper, palladium, nickel, silver, platinum, cobalt, gold or a combination thereof. A secondary metal layer may be electrolessly or electrolytically applied on top of the primary metal layer. Copper is usually the metal of choice when forming a printed circuit. A composite of a copper layer followed by a nickel layer is the preferred choice in preparing an EMI shielded enclosure however a metal layer may also comprise a first nickel layer proximately positioned to the surface followed by a copper layer and a second nickel layer on top copper layer, wherein the copper layer is sandwiched between the first and the second nickel layers. The nickel layer is typically used to protect the EMI copper layer shield from corrosion and abrasion.

Electrcless baths are well-known in the art and are generally described in the *Kirk-Othmer Encyclopedia of Chemical Tecnhology*, 3rd Edition, Volume 8, the contents of. which are incorporated herein by reference. The selection of a particular bath or electroless plating process is not critical to the present invention. The contents of the bath and the particular plating parameters, e.g., temperature, pH, and immersion time, will of course depend on the particular plastic serving as the substrate, and also upon the particular metal being deposited thereon. Suitable plating baths include the Shipley Cuposit ® 250 system, the Enplate ® Cu-406 and the Enplate ® Ni-426 systems, latter two made by Enthone Inc. Furthermore, the Grubb et al. application and Dumas et al. patent, mentioned above, list suitable electroless plating formulations. Immersion times, bath temperatures, and other operating parameters can be determined and controlled according to manufacturers' suggestions in order to deposit the metal layer of a desired thickness in a desired duration of time. Those having ordinary skill in the plating art will be able to determine the most appropriate plating regimen for a particular situation. In a preferred electroless plating step 28 in FIG. 28 the surface is contacted for about 8 minutes and at about 82° C. with Enplate ® 426, made by Enthone Inc. A rinse 30, shown in FIG. 1, of about two minutes is then carried out.

The surface may be electrolessly plated until a metal layer of desired thickness is achieved. The process may be then terminated and article produced thereby stored 32.

The polycarbonate surface may be subjected to heat treatment 34, shown in FIG. 1, after electroless deposition of the metal. Oven heating of the entire article, i.e., substrate with metal thereon, is sufficient, although any heating method is suitable. Typically, this heat treatment is carried out at a temperature ranging from about 45° C. to about 130° C. for about 5 minutes to about 120 minutes, with higher temperatures within the above range generally compensating for shorter duration, and vice versa. The aforementioned heat treatment is preferably carried out at about 110° C. Although the mechanism is not understood, the heat treatment appears to reduce the time required to attain optimal adhesion.

If another layer of metal is to be electrolytically applied on the surface, e.g., by electroplating, the above-described heat treatment can in some instances be omitted if a heat treatment is employed after the plating of more of the metal, as described below. However, preferably the heat treatment is provided prior to electrolytic deposition of metal. The substrate is heat treated after applying the secondary metal layer on the primary layer at a temperature of about 45° C. to about 120° C. for about 15 minutes to about 20 hours. Some of the embodiments include a heat treatment prior to the deposition of more of the metal (i.e., after the electroless deposition), along with another heat treatment after the final layer of metal has been applied, as described below.

Electroplating 36, shown in FIG. 1, is the one of the application methods for depositing a secondary or a second metal layer on top of the primary or first layer. However electroless plating 28, shown in FIG. 1, is the preferred method of depositing the second metal layer. The substrate is usually cleaned prior to immersion in the electroplating bath. The cleaning can be performed by rinsing the substrate with a dilute solution of a strong acid, such as 10% by weight sulfuric acid in water.

Electroplating or electrolytic plating baths are well-known in the art and are described, for example, in U.S. Pat. No. 4,555,315, incorporated herein by reference, although the particular electroplating bath used is not critical to the present invention. The choice of course depends in part on the particular metal being deposited. Suitable metals include those described for the electroless deposition. Furthermore, those skilled in the art appreciate that the particular bath contents will depend upon some of the factors considered for the electroless deposition of metal described above. Typically, the electroplating bath for copper is operated at a temperature ranging from about 16° C. to about 38° C., with a cathode current density in the range of about 1 ASF to about 80 ASF. A description of baths for plating copper or various other metals is given in the *Kirk-Othmer* reference described above, in Vol. 8, beginning on page 826. Baths used to apply a layer of copper to the electrolessly applied layer typically include an aqueous acidic copper electrolyte such as those of the acidic copper sulfate or acidic copper fluoroborate type; halide ions, such as chloride and/or bromide ions; and various other components well-known in the art. The thickness of this second metal layer will of course depend upon the desired end use of the metal-coated substrate.

As also described in the aforementioned application of Grubb et al., and in the patent of Foust et al. the metal applied on the polycarbonate substrate may be in the form of a pattern. Exemplary patterning methods are also described in U.S. Pat. No. 3,562,005, issued to DeAngelo et al., incorporated herein by reference. Another technique suitable for use herein is disclosed in the aforementioned Grubb et al. application. This resistless technique involves the photopatterning of an organic substrate by first exposing the substrate to electromagnetic radiation followed by treatment with a precious metal compound to catalytically activate the surface. The metallic pathway formed after electrolessly plating the activated surface will tightly adhere to the underlying polymer substrate because of the chemical modification treatment disclosed in the present invention.

The electrolessly metallized layer when used as an EMI shield is preferably about two micrometers in thickness. In other embodiments, such as a printed circuit board, the electrolessly metallized layer prepared by the method of this invention usually has a thickness of about 1 micrometers to about 5 micrometers and the electrolytically applied layer thereon is also about 1 to about 45 micrometers in thickness.

An article prepared by the method of this invention comprises a polycarbonate substrate having a surface with etch pits having the aspect ratio of less than about 4 and a metal layer disposed on the surface. The metal layer comprises an electrolessly applied primary layer on the pretreated surface. Additional secondary metal layers may be electrolessly or electrolytically applied on top of the primary metal layer until a desired thickness is attained. The present invention contemplates various combinations of metal layers such as a single copper layer, a primary copper layer followed by a secondary nickel layer or a primary nickel layer followed by a secondary copper layer and a tertiary nickel layer.

Articles of various embodiments of this invention are suitable as EMI shielded enclosures, printed circuit boards or housings having an EMI shield and a printed circuit board wherein the housing has an integrally created shell and a circuit board substrate. The substrate has metallic layers as described herein as a printed circuit pattern or "trace" and the shell walls have the EMI shield.

An article of manufacture of the preferred embodiment is an article such as an EMI shielded enclosure made of polycarbonate having surfaces of the walls of the enclosure chemically treated by the process of the present invention to improve electroless deposition a first metal layer preferably copper thereon. A second metal layer preferably of nickel may be disposed on top of the first metal layer, the second layer being electrolessly or electrolytically applied on the first layer. As stated earlier, the second layer is preferably deposited by electroless metal deposition. Both the metal layers may be disposed, if so desired, on the interior sides of the walls of the enclosure. The combined thickness of the metal layers is adjusted to meet the requirements set forth in the FCC regulations for noise by reducing intensity of noise emitted by the electrical components enclosed within the enclosure to a desired level. The shielding of the enclosure may be also used to protect the electrical components enclosed within the shielded enclosure from electro-magnetic radiation of a specified range of frequency of about 1 KiloHertz to about 10 GigaHertz.

Another embodiment of the present invention is an article such as an EMI shielded enclosure having three metal layered EMI shields. Preferably the first layer is electrolessly applied first nickel layer on the surfaces of the walls of the enclosure, the second layer being an electrolessly applied or electrolytically applied copper disposed on top of the first nickel layer and the third layer being electrolessly applied or electrolytically applied second nickel layer disposed on top of the second layer.

Still another embodiment is a flat or three-dimensional printed circuit board (PCB) of the present invention. The PCB comprises a polycarbonate substrate whose surfaces have been chemically treated in accordance with the process of the present invention to improve adhesion of an electrolessly applied first metal layer, followed by an electrolessly applied or an electrolytically applied second metal layer disposed on top of first metal layer, wherein the first and second metal layer provide a pattern of traces of desired thickness with which to provide electrical interconnection between electrical components disposed on the PCB and external terminal means. The preferred metal layers are of copper.

Yet another embodiment of the present invention is a reflector for a light emitting device wherein a surface of a polycarbonate reflector housing is provided a reflective metal layer such that light produced by the light emitting device is reflected by the metal layer.

The present invention will be further understood from the description of specific examples which follow. These examples are intended for illustrative purposes only and should not be construed as a limitation upon the broadest aspects of the invention.

In the examples to follow, adhesion of the metal to the substrate was evaluated by applying ASTM D3359-78, Method B Cross-Cut Tape Test (Cross Hatch Tape Test) mentioned earlier and, summarized below, comprises:

1. cutting, with a sharp knife blade, a cross hatch pattern in single pass uniformly applied strokes through the metal layer disposed on the substrate area being evaluated by the test;
2. removing the debris generated during the cutting procedure;
3. evenly applying over the cross hatched area the recommended adhesive tape, having an adhesive strength of 36±2.5 ounce per inch;
4. pulling the tape away from the area at 90° to the surface in one quick stroke; and
5. checking the tape for any metal flakes.

A classification of 5 means no metal layer was flaked off the surface whereas a classification of 0 means greater than 65% of the metal layer was flaked off the surface. The intermediate range of classification denotes percentages of flaking occuring between greater 0% to less than 65%. The classification values for each tape are obtained and then averaged.

Adhesion of the metal to the substrate was further evaluated by applying IPC-TM-650, Method 2.4.8.1 Peel test. In the aforementioned Peel Test adhesion of the metal to the substrate was evaluated by measuring the force, in pounds per inch, necessary to peel ⅛th inch strips of the metal from the substrate surface. In the test, the ⅛th inch strips were prepared by a patterning technique using nitric acid as an etchant. The end of each metal strip was clipped to an AMETEK digital force measuring gage connected to a computer processor. The force values to lift the metal strips from the polycarbonate substrate were converted by the computer to pounds per inch peel values. Multiple peel values were obtained and then averaged for each strip.

EXAMPLE I

A substrate formed from 1 inch by 3 inch by ⅛ inch Lexan ® 920 A polycarbonate slab, was treated as follows:

| Step | Procedure[a] | Time (minutes) |
|---|---|---|
| A | clean in Freon ® TF | 2 |
| B | dry the substrate | |
| C | expose to UV light[b] | 30 |
| D | HCl (36%)[c] @ 25° C. | 5 |
| E | water rinse | 5 |
| F | KOH (5N), @ 65° C. | 5 |
| G | water rinse | 2 |
| H | KMnO₄ (60 grams/Liter), KOH(1.2N), @ 82° C. | 10 |
| I | water rinse | 2 |
| J | Shipley Neutralizer ® 216(20%)[d], @ 50° C. | 5 |
| K | water rinse | 2 |

[a]substrate was immersed in the liquid components.
[b]254 nanometer light, from Hanovia U-tube lamps, held 2 inches from the substrate.
[c]by weight.
[d]by volume.

Table 1 represents a chemical elemental analysis performed on the polycarbonate slab by X-ray photoelectron spectroscopy to a depth of about 50 Å.

TABLE 1

Analysis of Substrate Surface

| Sample | Surface compositions, Atomic % | |
|---|---|---|
| | C | O |
| Control[a] | 84.2 | 15.8 |
| Untreated[b] | 82.6 | 15.9 |
| After Step K of example I | 78.8 | 19.9 |

[a]Theoretical composition of polycarbonate.
[b]Composition of polycarbonate sample prior to any treatment.

Tables 1 and 2 represent a chemical analysis performed on various types of carbon bonds disposed on the surface of the polycarbonate slab by X-ray photoelectron spectroscopy to a depth of about 50 Å.

Analysis of carbon spectra

| Sample | Surface Composition, Atomic % | | | |
|---|---|---|---|---|
| | C—C, C=C, C—H | C—O | C=O | O ∥ O—C—O |
| Theoretical | 81 | 12 | — | 6 |
| As-received | 76 | 14 | — | 7 |
| After Step K of example I | 59 | 35 | 5 | 1 |

After completing the chemical analysis the slab was then subjected to the following procedure.

| Step | Procedure[a] | Time (minutes) |
|---|---|---|
| L | Shipley Cataprep ® 404, @ 25° C. | 1 |
| M | Shipley Cataposit ® 44 (1½%)[d], @ 44° C. | 3 |
| N | water rinse | 2 |
| O | Shipley Accelerator ® 19, @ 25° C. | 3 |
| P | water rinse | 2 |
| Q | Enthone Enplate ® Ni-426, @ 82° C.[e] | 8 |
| R | water rinse | 2 |
| S | dry at 110° C. | 2 hours |
| T | electrolytic copper plating, 30 asf[c], @ 25° C. (140 grams/Liter CuSO₄.5H₂O, 50 grams/Liter H₂SO₄, 175 ppm chloride, 3% Electrochemical's Electro-Brite PC 667 Additive)[f] | 1 hour |
| U | dry at 110° C. | 16 hours |

[a]substrate was immersed in the liquid components.
[c]Amperes per square foot.
[d]by weight.
[e]nickel plating thickness @ 3 micrometers.
[f]copper plating thickness @ 42 micrometers.

Average peel strength - 5.4 lbs/inch.
Classification of 5 under Cross Hatch Tape Test.

EXAMPLE II

A substrate formed of 1 inch by 3 inch by ⅛ inch Lexan ® 123 polycarbonate slab was treated as follows:

| Step | Procedure[a] | Time (minutes) |
|---|---|---|
| A | clean in Freon ® TF | 2 |
| B | dry | |
| C | H₂SO₄/HNO₃(2/1)[b], @ 25° C. | 5 |
| D | water rinse | 5 |
| E | dry | |
| F | H₂SO₄(96%)[c], @ 25° C. | 3 |
| G | water rinse | 2 |
| H | KOH(5N), @ 65° C. | 5 |
| I | KMnO₄(15 grams/Liter), KOH (1.2N), @ 75° C. | 5 |
| J | water rinse | 2 |
| K | Shipley Neutraclean ® 68 (50%)[b], @ 25° C. | 5 |
| L | water rinse | 2 |
| M | Shipley Cleaner/Conditioner ® 1175A, @ 25° C. | 5 |
| N | water rinse | 2 |
| O | Shipley Cataprep ® 404, @ 25° C. | 1 |
| P | Shipley Cataposit ® 44 (1½%)[b], @ 44° C. | 3 |
| Q | water rinse | 2 |
| R | Shipley Accelerator ® 19, @ 25° C. | 3 |
| S | water rinse | 2 |
| T | Shipley Cuposit ® 250, @ 48° C.[d] | 5 |
| U | water rinse | 2 |
| V | dry @ 95° C. | 2 hours |
| W | electrolytic plating, 30 asf[e] @ 25° C. (140 grams/Liter CuSO₄.5H₂O, 50 grams/Liter H₂SO₄, 175 ppm chloride, 3% Electrochemical's Electro-Brite PC 667 Additive)[f] | 1 hour |
| X | dry @ 95° C. | 16 hours |

[a]Substrate was immersed in the liquid components.
[b]by volume.
[c]by weight.
[d]copper plating thickness @ 0.4 micrometers.
[e]amperes per square foot.
[f]copper plating thickness @ 42 micrometers.

Average peel strength - 16.9 lbs/inch.
Classification of 5 under Cross Hatch Tape Test.

EXAMPLE III

A substrate formed of 1 inch by 3 inch by ⅛ inch Lexan ® 920 A polycarbonate slab was treated as follows:

| Step | Procedure[a] | Time (minutes) |
|---|---|---|
| A | clean in Shipley Acid Cleaner 1118, @ 65° C. | 5 |
| B | water rinse | 2 |
| C | dry | |
| D | HNO₃/H₃PO₄(99/1)[b], @ 45° C. | 5 |
| E | water rinse | 5 |
| F | dry | |
| G | H₂SO4 (96%)[c], @ 45° C. | 1 |
| H | water rinse | 2 |
| I | KOH (5N), @ 65° C. | 5 |
| J | water rinse | 2 |
| K | cetylpyridinium chloride (1%), @ 50° C. | 5 |

-continued

| Step | Procedure[a] | Time (minutes) |
|---|---|---|
| L | water rinse | 2 |
| M | Shipley Cataprep ® 404, @ 25° C. | 1 |
| N | Shipley Cataprep ® 44 (1½%)[b], @ 44° C. | 3 |
| O | water rinse | 2 |
| P | Shipley Circuposit ® 3350, @ 45° C.[d] | 20 |
| Q | water rinse | 2 |
| R | dry @ 95° C. | 2 hours |
| S | electrolytic plating, 30 asf[e], @ 25° C. (140 grams/Liter CuSO₄.5H₂O, 50 grams/Liter H₂SO₄, 175 ppm chloride, 3% Electrochemical's Electro-Brite PC 667 Additive)[f] | 1 hour |
| T | dry @ 110° C. | 16 hours |

[a] Substrate was immersed in the liquid components.
[b] by volume.
[c] by weight.
[d] copper plating thickness @ 1 micrometers.
[e] Amperes per square foot.
[f] copper plating thickness @ 42 micrometers.
Average peel strength - 14.2 lbs/inch.
Classification of 5 under Cross Hatch Tape Test.

EXAMPLE IV

A substrate formed of 1 inch by 3 inch by ⅛ inch Lexan ® 920 A polycarbonate slab was treated as follows:

| Step | Procedure[a] | Time (minutes) |
|---|---|---|
| A | clean in Freon ® TF (1,1,2-trichlorotrifluoroethane) @ room temperature[c] | 2 |
| B | dry | |
| C | expose to UV light[b] | 30 |
| D | HCl (37%)[d], @ room temperature[c] | 5 |
| E | water rinse | 5 |
| F | KOH (5N), @ 80° C. | 5 |
| G | water rinse | 2 |
| H | KMnO₄(60 gram/Liter), KOH (1.2N), @ 80° C. | 10 |
| I | water rinse | 2 |
| J | Shipley Neutralizer ® MLB216, @ 53° C. | 5 |
| K | water rinse | 2 |
| L | Shipley Cataprep ® 404, @ room temperature[c] | 1 |
| M | Shipley Cataposit ® 44(1½%)[e], @ 44° C. | 3 |
| N | water rinse | 2 |
| O | Shipley Accelerator ® 19, @ room temperature[c] | 3 |
| P | water rinse | 2 |
| Q | Enthone Enplate ® Ni-426, @ 60° C., pH 6.2[f] | 6 |
| R | water rinse | 2 |
| S | Shipley Cuposit ® 251, @ 48° C.[g] | 30 |
| T | water rinse | 2 |
| U | dry @ 50° C. | 2 hours |
| V | H₂SO₄ (10%)[e], @ room temperature[c] | ½ |
| W | water rinse | 2 |
| X | PdCl₂ (0.1%)[d], HCl(1%)[e], @ room temperature[c] | 1 |
| Y | water rinse | 2 |
| Z | Enthone Enplate Ni-426, @ 60° C., pH 6.2[h] | 20 |
| AA | water rinse | 2 |
| BB | dry @ 50° C. | 2 hours |

[a] Substrate was immersed in the liquid components.
[b] Hanovia UV light located at 2 inches from the sample.
[c] 23° C.-27° C.
[d] by weight.
[e] by volume.
[f] nickel plating thickness @ 1 micrometer.
[g] copper plating thickness @ 1.5 micrometers.
[h] nickel plating thickness @ 3 micrometers.
Classification of 5 under Cross Hatch Tape Test.

It will be understood that the foregoing description and drawings are only illustrative of the present invention and it is not intended that the invention be limited thereto. Numerous variations, changes, substitutions, and modifications will now occur to those skilled in the art which come within the scope of the present invention without departing from the spirit and scope thereof. Accordingly, it is intended that the invention be limited only by the scope of the appended claims.

What is claimed is:

1. A method of metallizing a polycarbonate surface comprising:
    exposing said polycarbonate surface to actinic light to wet said surface;
    impregnating said wetted surface with a diffuser comprising an aqueous solution of a compound selected from the group consisting of hydrogen halide, ammonia, nitric acid mixed with sulfuric acid, and nitric acid mixed with orthophosphoric acid;
    etching said impregnated surface with a base;
    cleaning said etched surface with a cleansing agent; and
    applying a metal layer on said cleaned surface.

2. The method of claim 1 wherein said step of applying said metal layer comprises:
    electrolessly applying a primary metal layer on said cleaned surface;
    electrolessly or electrolytically applying a secondary metal layer on top of said primary layer.

3. The method of claim 1 wherein said metal layer comprises copper, nickel, gold, silver, platinum, palladium, cobalt or a combination thereof.

4. The method of claim 1 wherein said metal layer comprises a copper layer proximately positioned to said surface followed by a nickel layer on top of said copper layer.

5. The method of claim 1 wherein said metal layer is applied on said surface to form an electromagnetic interference shield.

6. The method of claim 1 wherein said metal layer on said surface is patterned to form a printed circuit pathway of a printed circuit board.

7. The method of claim 1 wherein said polycarbonate surface having said primary metal layer thereon is heat treated at a temperature of about 45° C. to about 130° C. for about 5 minutes to about 120 minutes, prior to applying said secondary metal layer on said primary layer.

8. The method of claim 1 wherein said polycarbonate surface is heat treated after applying said secondary metal layer on said primary layer at a temperature of about 45° C. to about 120° C. for about 15 minutes to about 20 hours.

9. A method of metallizing a polycarbonate surface comprising:
    wetting said surface for about 30 minutes with ultraviolet light having a frequency of about 254 nanometers to increase hydrophilicity of said surface;
    impregnating said wetted surface at about 25° C. for about 5 minutes with hydrochloric acid dissolved in water at a concentration of at least about 36% by volume;
    etching said impregnated surface at about 65° C. for about 5 minutes with potassium hydroxide dissolved in water at a concentration of 30% by weight;
    cleaning said etched surface at about 82° C. for about 10 minutes with a aqueous mixture potassium permanganate at concentration of 6% by weight and potassium hydroxide at a concentration of 7% by weight to purge debris from etch pits;
    neutralizing said cleaned surface with an aqueous solution of hydroxylamine hydrochloride at a temperature of about 50° C. and at a concentration of about 5% by weight; and
    applying a metal layer on the neutralizing surface.

* * * * *